(12) United States Patent
Hirose et al.

(10) Patent No.: US 8,466,825 B2
(45) Date of Patent: Jun. 18, 2013

(54) COMBINED ELECTROMAGNETIC WAVE ABSORBER

(75) Inventors: Keita Hirose, Saitama (JP); Takashi Ono, Saitama (JP)

(73) Assignee: Kabushiki Kaisha Riken, Tokyo (JP)

( * ) Notice: Subject to any disclaimer, the term of this patent is extended or adjusted under 35 U.S.C. 154(b) by 132 days.

(21) Appl. No.: 13/002,227

(22) PCT Filed: Apr. 8, 2009

(86) PCT No.: PCT/JP2009/057211
§ 371 (c)(1),
(2), (4) Date: Dec. 30, 2010

(87) PCT Pub. No.: WO2009/128377
PCT Pub. Date: Oct. 22, 2009

(65) Prior Publication Data
US 2011/0227775 A1    Sep. 22, 2011

(30) Foreign Application Priority Data

Apr. 15, 2008 (JP) ................................. 2008-105656

(51) Int. Cl.
*H01Q 17/00* (2006.01)
(52) U.S. Cl.
USPC .................................................. 342/4; 342/1
(58) Field of Classification Search
USPC ........................................................ 342/1–4
See application file for complete search history.

(56) References Cited

U.S. PATENT DOCUMENTS

| 6,784,419 | B1 * | 8/2004 | Hayashi et al. ................ 250/250 |
| 2006/0246261 | A1 * | 11/2006 | Kasabo et al. ................. 428/182 |
| 2007/0030194 | A1 | 2/2007 | Kurihara et al. |

FOREIGN PATENT DOCUMENTS

| JP | 62-40798 A | 2/1987 |
| JP | 8-274491 A | 10/1996 |
| JP | 2001-127483 A | 5/2001 |
| JP | 2004-253760 A | 9/2004 |
| JP | 2007-67395 A | 3/2007 |

OTHER PUBLICATIONS

International Search Report for PCT/JP2009/057211 dated May 12, 2009.

* cited by examiner

*Primary Examiner* — Timothy A Brainard
(74) *Attorney, Agent, or Firm* — Kenealy Vaidya LLP

(57) ABSTRACT

An electromagnetic wave absorber is provided which has an outstanding electromagnetic wave absorption property with a return loss of 20 dB or greater in a wide frequency band of 30 MHz to 20 GHz. A combined electromagnetic wave absorber includes a magnetic absorber plate, a crossed electromagnetic wave absorber disposed on the magnetic absorber plate, and a compact electromagnetic wave absorber disposed in a space defined by the dielectric loss plates of the crossed electromagnetic wave absorber on the magnetic absorber plate. When viewed in the direction perpendicular to the magnetic absorber plate, the compact electromagnetic wave absorber is configured in a multilayer structure having a plurality of electromagnetic wave absorbent layers with a low dielectric layer interposed therebetween.

4 Claims, 8 Drawing Sheets

(A)  (B)

Fig. 6
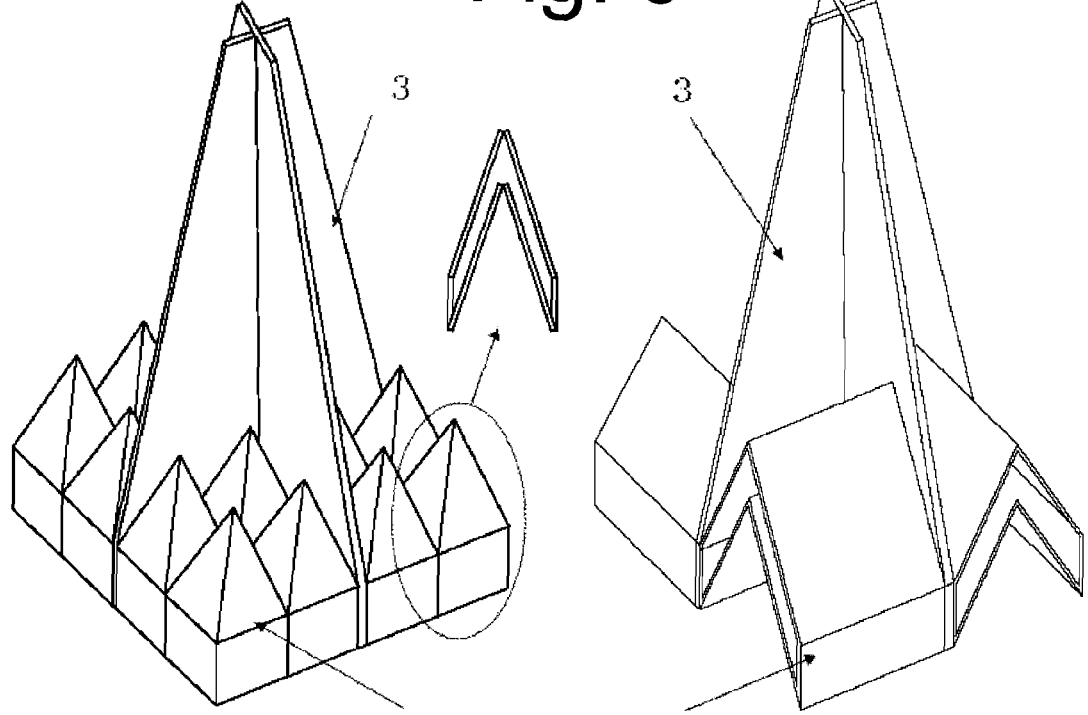
(A)           (B)
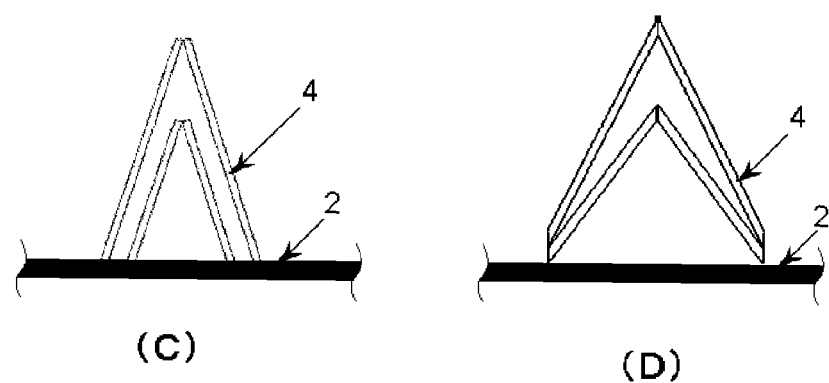
(C)           (D)

COMBINED ELECTROMAGNETIC WAVE ABSORBER

This application is a U.S. national phase filing under 35 U.S.C. §371 of PCT Application No. PCT/JP2009/057211, filed Apr. 8, 2009, and claims priority under 35 U.S.C. §119 to Japanese patent application no. 2008-105656, filed Apr. 15, 2008, the entireties of both of which are incorporated by reference herein.

TECHNICAL FIELD

The present invention relates to an electromagnetic wave absorber for absorbing electromagnetic waves, and in particular to a combined electromagnetic wave absorber used in anechoic rooms.

BACKGROUND ART

Anechoic rooms are widely used as a measurement chamber for evaluating electromagnetic interference (noise) generated from various types of electronics apparatuses or for evaluating EMC (Electromagnetic Compatibility) to examine for resistance of electronics apparatus against extraneous electromagnetic noise. Recently, in addition to the applications mentioned above, the anechoic room has been also employed as a calibration measurement chamber for calibrating antennas. The anechoic room is largely divided, depending on its size, into three types; the compact anechoic room, the 3 m-method anechoic room, and the 10 m-method anechoic room. The types of the anechoic room to be used are determined depending on the subject to be measured or the measurement method.

The anechoic room is provided with electromagnetic wave absorbers on its sidewalls, ceiling, and floor. The electromagnetic wave absorbers are differently configured depending on the requirements or size of the anechoic room installed. In general, combined electromagnetic wave absorbers are frequently used which have a basic configuration with a combination of a magnetic absorber plate, such as a ferrite tile and a dielectric loss material. Such combined electromagnetic wave absorbers are known to have an advantageous electromagnetic wave absorption property in a wide frequency band. This is because it allows the dielectric loss material to absorb electromagnetic waves in a frequency band of 300 MHz or greater and the ferrite tile to absorb electromagnetic waves in a frequency band lower than that.

In general, the dielectric loss materials can be formed of a mixture of a base material, such as foamed polystyrene or foamed urethane, and a conductive material, such as carbon black or graphite. As for its shape, the electromagnetic wave absorber used can be formed in the shape of a wedge or a pyramid. In particular, the pyramidal shape, which is known to have no formal anisotropy and to be capable of efficiently absorbing electromagnetic waves incident at various angles of incidence, is utilized in various types of anechoic rooms. The electromagnetic wave absorber, either wedge-shaped or pyramid-shaped, has a height that depends on the size of the anechoic room but is typically as high as approximately 0.5 m to 2.0 m, which is required to cope with a wide frequency band of electromagnetic waves. Accordingly, conventional solid electromagnetic wave absorbers were massive both in weight and volume, posing a problem with their installability.

Recently, such electromagnetic wave absorbers have been focused which are improved in moldability and installability and can be easily transported. Examples of those absorbers include a hollow absorber made up of an electromagnetic wave absorber plate containing an electrically conductive material, and a crossed electromagnetic wave absorber with the electromagnetic wave absorber plates crossing each other. A combined electromagnetic wave absorber is disclosed in Patent Document 1. The combined electromagnetic wave absorber includes a crossed electromagnetic wave absorber and compact electromagnetic wave absorbers. The crossed electromagnetic wave absorber is formed such that a plurality of polygonal, for example, triangular or trapezoidal, electromagnetic wave absorber plates cross each other and are placed on a bottom plate. The compact electromagnetic wave absorber has the shape of, for example, a wedge, a pyramid, or slanting plate, which is disposed on the bottom plate between the electromagnetic wave absorber plates. Such a combined electromagnetic wave absorber can provide a good impedance matching property derived from the crossed absorber, while the compact electromagnetic wave absorber can provide an improved electromagnetic wave absorption property in a high-frequency band. It is thus possible to reduce costs while maintaining an excellent electromagnetic wave absorption property.

Recently, as information is transferred at increased speeds and densities, electronics apparatus have been ever increased in their service frequencies. In this context, the anechoic room used for evaluating these electronics apparatuses has also been demanded for higher performance. More specifically, such an electromagnetic wave absorber is demanded which efficiently absorbs electromagnetic waves in a wider frequency band which includes a high-frequency band of 1 GHz to 20 GHz in addition to the conventionally required frequency band of 30 MHz to 1 GHz.

The combined electromagnetic wave absorber disclosed in Patent Document 1 can provide an improved electromagnetic wave absorption property in a high-frequency band by increasing the carbon content or the concentration of an electrically conductive material contained in the compact absorber. However, an increase in the carbon content of the compact electromagnetic wave absorber causes electromagnetic waves to be reflected on the compact electromagnetic wave absorber, thus inhibiting the arrival of the electromagnetic waves at the magnetic absorber plate. Accordingly, the magnetic absorber plate cannot make use of its electromagnetic wave absorption performance, resulting in degradation of the property in low-frequency bands. As can be seen from above, there are no electromagnetic wave absorbers currently available to provide an excellent electromagnetic wave absorption performance in such a wide frequency band as from 30 MHz to 20 GHz.

[Patent Document 1] Japanese Patent Application Laid-Open No. 2001-127483

DISCLOSURE OF THE INVENTION

Problems to be Solved by the Invention

The present invention was developed in view of the problems described above. It is therefore an object of the present invention to provide an electromagnetic wave absorber which has an excellent electromagnetic wave absorption property of a return loss 20 dB or greater in a wide frequency band of 30 MHz to 20 GHz.

Means for Solving the Problems

As a result of intensive studies in view of the aforementioned object, the present inventors have devised a combined electromagnetic wave absorber which includes a magnetic absorber plate, a crossed electromagnetic wave absorber placed on the magnetic absorber plate and including dielectric loss plates, and a compact electromagnetic wave absorber disposed in a space defined by the dielectric loss plates of the crossed electromagnetic wave absorber on the magnetic absorber plate. In this combined electromagnetic wave absorber, the compact electromagnetic wave absorber is configured in a multi-layer structure having a plurality of electromagnetic wave absorbent layers disposed in a direction perpendicular to the magnetism absorber plate and a low dielectric layer interposed between the electromagnetic wave absorbent layers and having a dielectric constant lower than the electromagnetic wave absorbent layers. In other words, the electromagnetic wave absorbent layers and the low dielectric layer are layered in the direction perpendicular to the magnetic absorber plate. The present inventors have found that such a particular combined electromagnetic wave absorber can provide significant improvements in the electromagnetic wave absorption property in a high-frequency band while maintaining the electromagnetic wave absorption property in a low-frequency band. With this finding, the invention reached completion. That is, the combined electromagnetic wave absorber of the present invention includes: a magnetic absorber plate; a crossed electromagnetic wave absorber having a plurality of crossed dielectric loss plates disposed perpendicular to the magnetic absorber plate; and a compact electromagnetic wave absorber disposed in a space defined by the dielectric loss plates of the crossed electromagnetic wave absorber on the magnetic absorber plate. In the combined electromagnetic wave absorber, the compact electromagnetic wave absorber is configured to have, a plurality of electromagnetic wave absorbent layers and a low dielectric layer interposed between the electromagnetic wave absorbent layers and having a dielectric constant lower than the electromagnetic wave absorbent layers, the electromagnetic absorbent layers and the low dielectric layer being disposed in a direction perpendicular to the magnetic absorber plate.

Advantageous Effect of the Invention

According to the present invention, a plurality of electromagnetic wave absorbent layers with a low dielectric layer interposed therebetween are disposed in a space defined by the crossed electromagnetic wave absorber on the magnetic absorber plate, thereby causing electromagnetic waves to reach the electromagnetic wave absorbent layers multiple times. Thus, a synergistic effect occurs between the attenuation effect on electromagnetic waves by thermal conversion in the respective electromagnetic wave absorbent layers and the cancelling effect of electromagnetic waves due to their phase difference. The synergistic effect can improve the effective absorption of electromagnetic waves in a wider frequency band. The aforementioned effects can be realized without increasing the content of electrically conductive material contained in the electromagnetic wave absorber. It is thus not necessary to increase the content of the electrically conductive material in order to improve the electromagnetic wave absorption property in a high-frequency band. Accordingly, the magnetic absorber plate can make full use of its electromagnetic wave absorption performance in a low-frequency band, thus providing an excellent electromagnetic wave absorption property in a wide frequency band from a low-frequency band to a high-frequency band.

BEST MODES FOR CARRYING OUT THE INVENTION

Now, an electromagnetic wave absorber of the present invention will be described below in more detail with reference to the accompanying drawings.

FIG. 1 illustrates an example of a combined electromagnetic wave absorber of the present invention. The combined electromagnetic wave absorber 1 of the present invention basically includes a magnetic absorber plate 2, a crossed electromagnetic wave absorber 3 disposed on the magnetic absorber plate 2, and compact electromagnetic wave absorbers 4 disposed in a space defined by the crossed electromagnetic wave absorber 3 on the magnetic absorber plate 2. In the following descriptions referring to this structure with the electromagnetic wave absorber 3 located on top of the magnetic absorber plate 2, it should be noted that the direction perpendicular to the magnetic absorber plate 2 is defined as the vertical direction or up-and-down direction, and the electromagnetic wave absorber 3 side is referred to as the upward direction. Accordingly, in the individual descriptions below, no reference will be explicitly made to directions unless otherwise specified.

The magnetic absorber plate 2 used may typically be a ferrite tile.

The crossed electromagnetic wave absorber 3 is formed of plates made of a dielectric loss material. The plate is typically formed, for example, in the shape of a sheet, in a corrugated cardboard structure, or in a honeycomb structure. Examples of such a dielectric loss material may include carbon-containing foamed urethane, carbon-containing foamed styrene, and carbon-containing foamed polypropylene. It is also possible to employ an alternative dielectric loss material, for example, plastics, paper, an inorganic material such as silica or alumina, or the like, which contains carbon or is coated with a carbon layer. The dielectric loss material has a carbon content of a range typically from 0.05 mass % to 1.5 mass % and preferably from 0.05 mass % to 1 mass %.

In general, the crossed electromagnetic wave absorber 3 is formed of mutually crossed polygonal dielectric loss plates of a dielectric loss material. An example of the crossed electromagnetic wave absorber 3 is shown in FIGS. 2(A) and 2(B). In this case, a polygonal dielectric loss plate 33 having a longitudinal notched portion at the top center (FIG. 2(A)) and another polygonal dielectric loss plate 33 having a longitudinal notched portion at the bottom center (FIG. 2(B)) are created, and combined together by fitting one notched portion to the other (see FIG. 3(A)). In this condition, the crossed electromagnetic wave absorber 3 is disposed perpendicular to the magnetic absorber plate 2. As used herein, the term "mutually crossed" refers to a structure in which at least part of the crossed electromagnetic wave absorber 3 has two or more dielectric loss materials mutually crossed in a cross section parallel to the magnetic absorber plate 2 on which the crossed electromagnetic wave absorber 3 is placed. The crossed electromagnetic wave absorber 3 may be fabricated in any process so long as the dielectric loss plate 33 has a mutually crossed configuration when viewed from a cross section parallel to the magnetic absorber plate 2. For example, it may be formed by affixing two bent dielectric loss plates to each other. The crossed electromagnetic wave absorber 3 is preferably directly disposed on the magnetic absorber plate 2. However, an intermediate layer can be disposed, as appropriate, between the magnetic absorber plate and the crossed electromagnetic wave absorber to such an extent that the characteristics of the magnetic absorber is not affected.

The embodiment shown in FIGS. 2(A) and 2(B) employs, by way of example, a modified hexagon (with each vertex of an isosceles triangle cut away) as a polygonal shape of the dielectric loss plate 33; however, the shape of the dielectric loss plate 33 is not limited thereto. For example, triangular, square (rectangular), or pentagonal dielectric loss plates can also be crossed to form the crossed electromagnetic wave absorber. According to the present invention, the width of the dielectric loss plate is preferably so shaped as to reduce from the bottom of the crossed electromagnetic wave absorber (the lower portion near the magnetic absorber plate) toward the top end thereof. Such a shape includes a triangular, trapezoidal, modified hexagonal shape. Using a dielectric loss plate of such a shape to form the crossed electromagnetic wave absorber in a tapered tilt structure would provide a concentration gradient for the conductive material in the vertical direction. It is thus possible to effectively absorb electromagnetic waves not only incident perpendicularly but also incident at various angles of incidence in a wider frequency band. Note that in such a tilt structure, each side might be straight or curved. For example, the tilt structure may include, as an example, a linear tilt structure as shown in FIG. 3(A) or a curved tilt structure as shown in FIG. 3(B).

To improve the absorbency of the electromagnetic wave absorber, it is effective to reduce the vertical change in dielectric constant from the top to the bottom of the electromagnetic wave absorber, thereby reducing the amount of reflection on the surface of the electromagnetic wave absorber as much as possible. To this end, the tip angle θ of the crossed electromagnetic wave absorber needs to be reduced to as small an acute angle as possible, thereby making the concentration gradient of the conductive material less steep. More specifically, the tip angle θ of the crossed electromagnetic wave absorber is preferably 1 to 45 degrees, and more preferably 5 to 30 degrees (see FIG. 2(A)).

The anechoic room has a size limit, for example, a typical room size of 15 m×24 m×9 m (height) for the 10 m method anechoic room widely used for EMC assessments. Furthermore, the foot print of an electromagnetic wave absorber to be installed in the anechoic room is determined in consideration of costs and installability, and in general, its one side is set to approximately 600 mm. In such conditions, to design an anechoic room which has a good electromagnetic wave absorption property and a spacious effective space for measurement, the electromagnetic wave absorber preferably has a height of 600 mm to 2000 mm. Depending on the required performance of the anechoic room, the height and the tip angle θ of the crossed electromagnetic wave absorber are adjusted as appropriate.

Here, suppose that the low dielectric layer 11 has a vertical thickness of $t_{11}$ (mm) (corresponding to "h" shown in FIG. 4); the electromagnetic wave absorbent layers 12 and 13 have a dielectric constant of $\in_{12}$ and $\in_{13}$, respectively; and the electromagnetic wave absorbent layers 12 and 13 have a vertical thickness of $t_{12}$ (mm) and $t_{13}$ (mm), respectively. The characteristic values of the low dielectric layer 11 and the electromagnetic wave absorbent layers 12 and 13 are required to make full use of the electromagnetic wave absorbency in the low frequency band by the magnetic absorber plate 2. The characteristic values are also required to provide a good electromagnetic wave absorbency over a wide frequency band from the low frequency band to the high frequency band. The electromagnetic wave absorbent layer containing the same amount of carbon may have an apparently increased dielectric constant when it is decreased in thickness, whereas it may have an apparently reduced dielectric constant at an increased thickness. Using this characteristic, the range of the respective characteristic values of the electromagnetic wave absorbent layers 12 and 13 can be specified with the respective product ($\in_{12} \times t_{12}$, $\in_{13} \times t_{13}$) of the dielectric constants ($\in_{12}$, $\in_{13}$) and the thicknesses ($t_{12}$, $t_{13}$). More specifically, the product of the dielectric constant and the thickness (mm) may preferably be 10 to 40, and more preferably 20 to 35. Furthermore, the thickness $t_{11}$ (mm) of the low dielectric layer 11 varies depending on the characteristic values of the electromagnetic wave absorbent layers 12 and 13. More specifically, it is preferably set to 10 mm to 500 mm. However, the electromagnetic wave absorbent layers 12 and 13 themselves can sufficiently absorb microwaves when the characteristic values of the electromagnetic wave absorbent layers 12 and 13 are close to the upper limit, and thus can provide a sufficient absorbency even when $t_{11}$ (mm) is near the lower limit. Since the electromagnetic wave absorbent layers 12 and 13 themselves have a lower electromagnetic wave absorbency when the characteristic values of the electromagnetic wave absorbent layers 12 and 13 are near the lower limit, $t_{11}$ (mm) is preferably set to near the upper limit in order to obtain a sufficient absorbency.

FIG. 4 is a side view illustrating the combined electromagnetic wave absorber of the present invention shown in FIG. 1. The compact electromagnetic wave absorber 4, tilted from the dielectric loss plate 33 toward the magnetic absorber plate 2 (or having a slanting plate structure), is disposed in a space defined by the dielectric loss plates 33 on the magnetic absorber plate 2. In FIG. 4, the compact electromagnetic wave absorber 4 is formed of two slanting plates 121 and 123 disposed in parallel and two vertical plates 122 for linking between the slanting plates 121 and 123, with a low dielectric layer (in the illustrated example, being a space layer) 11 interposed therebetween. That is, the compact electromagnetic wave absorber 4 is configured to have two electromagnetic wave absorbent layers 12 and 13 (the slanting plates 121 and 123) with the low dielectric layer 11 interposed therebetween in the vertical direction. A plurality of electromagnetic wave absorbent layers 12 and 13 disposed in this manner allow electromagnetic waves to reach the layers 12 and 13 multiple times. Thus, a synergistic effect can be obtained between the attenuation effect on electromagnetic waves by thermal conversion in the electromagnetic wave absorbent layers 12 and 13 and the cancelling effect on electromagnetic waves due to their phase difference. This allows for effectively absorbing electromagnetic waves in a wider frequency band. The conventional single-layer structure required a higher concentration of an electrically conductive material in order to improve its electromagnetic wave absorption property in a high-frequency band. In contrast to this, the present invention provides the aforementioned effects, so that an improved electromagnetic wave absorption property in a high-frequency band can be realized without an increase in the concentration of the electrically conductive material contained in the electromagnetic wave absorber plate. Consequently, it is possible to make full use of the electromagnetic wave absorbent layers 12 and 13 in addition to the electromagnetic wave absorption performance in a low-frequency band provided by the magnetic absorber plate 2. Thus, an excellent electromagnetic wave absorption property is provided over a wide frequency band from a low-frequency band to a high-frequency band.

The effect of the present invention can be obtained by intervening, between the electromagnetic wave absorbent layers, a low dielectric layer that is filled with gas or solid to make its dielectric constant lower than those of the electromagnetic wave absorbent layers. The low dielectric layer has preferably a dielectric constant of 3 or less, and is more preferably an air layer (a space layer) in consideration of the dielectric constant and costs.

The embodiment shown in FIG. 4 employs the compact electromagnetic wave absorber 4 including the two slanting plates 121 and 123 and the vertical plates 122. However, the present invention is not limited thereto. Only two or more electromagnetic wave absorber plates 121 and 123 formed via the space layer (low dielectric layer) 11 can realize the effects of the present invention. However, the compact electromagnetic wave absorber 4 is preferably configured to have the vertical plates 122 because this configuration allows for coping with a wider range of electromagnetic waves and provides a structural stability for the reasons below. That is, consider a plurality of combined electromagnetic wave absorbers arranged so that short-wavelength high-frequency band electromagnetic waves arrive from above in the vertical direction at valleys between adjacent electromagnetic wave absorbers, i.e., at a lower portion of the compact electromagnetic wave absorber 4 in contact with the magnetic absorber plate 2. In this case, advantageously, the presence of the vertical plates 122 serves to support the electromagnetic wave absorber plates 121 and 123, keeping one separated from the other, and the vertical plates 122 can also absorb sufficiently the electromagnetic waves without letting them to reach directly the magnetic absorber plate 2.

The compact electromagnetic wave absorber 4 having a slanting plate structure shown in FIG. 4 can be easily formed, for example, by bending the rectangular electromagnetic wave absorber plate shown in FIG. 5 along the dotted lines and then applying an adhesive or the like to an overlap portion "d" so that it is stuck to an associated portion. Thus, the compact electromagnetic wave absorber of the slanting plate structure is significantly advantageous in terms of installability and costs.

As shown in FIG. 1, the compact electromagnetic wave absorbers 4 of the slanting plate structure that are disposed in the four spaces defined by the dielectric loss plates, respectively, are preferably oriented in different directions. Such a configuration, free from polarization dependency, allows for effectively absorbing those electromagnetic waves incoming at various angles.

As described above, the present invention provides the low dielectric layer 11 between the electromagnetic wave absorbent layers 12 and 13 of the compact electromagnetic wave absorber 4, thereby making use of the synergistic effect between the attenuation effect on electromagnetic waves by multiple times of thermal conversions in the electromagnetic wave absorbent layer and the cancelling effect on electromagnetic waves due to their phase difference. It is thus possible to adjust the performance of the low dielectric layer 11 by changing its thickness depending on the performance required. Typically, the thickness of the low dielectric layer is preferably set to 10 mm to 500 mm though it also depends on the entire size of the electromagnetic wave absorber. Note that as used herein, "the thickness of the low dielectric layer" refers to the vertical dimension "h" of the low dielectric layer 11 (in the direction perpendicular to the magnetic absorber plate 2) as shown in FIG. 4. Setting the thickness of the low dielectric layer 11 to the range mentioned above can significantly improve the electromagnetic wave absorption property in a high-frequency band, thus making outstanding use of the effects of providing the plurality of electromagnetic wave absorbent layers 12 and 13. Note that the embodiment shown in FIG. 4 provides one low dielectric layer and two electromagnetic wave absorbent layers; however, the present invention is not limited to this structure. For example, it is also possible to employ a structure with two low dielectric layers and three electromagnetic wave absorbent layers or a structure with a further increased number of low dielectric layers and electromagnetic wave absorbent layers.

The compact electromagnetic wave absorber 4 of the present invention is characterized by being configured to have a plurality of electromagnetic wave absorbent layers 12 and 13 with the low dielectric layer 11 interposed therebetween, these layers being layered in the direction perpendicular to the magnetic absorber plate 2. For example, even a structure with two electromagnetic wave absorbent layers 12 and 13 disposed with the low dielectric layer 11 interposed therebetween in parallel to the magnetic absorber plate 2 can cope with predetermined electromagnetic waves. More preferably, the present invention may provide a structure in which the compact electromagnetic wave absorber 4 is tilted at a given angle relative to the magnetic absorber plate 2. This structure provides a sufficient electromagnetic wave scattering effect and realizes an improved electromagnetic wave absorption property. It is thus preferable to ensure the tilt angle at which such electromagnetic waves scattering effects are realized and not to impair the electromagnetic wave absorption property of the magnetic absorber plate 2 due to the concentration of an electrically conductive material contained in the entire compact electromagnetic wave absorber 4. To this end, the compact electromagnetic wave absorber is preferably set to have a height (vertical dimension) of 200 mm to 700 mm. Note that as used herein, "the vertical dimension (height) of the compact electromagnetic wave absorber" refers to the vertical size "i" from the lowermost portion of the compact electromagnetic wave absorber 4, which is in contact with the magnetic absorber plate 2 as shown in FIG. 4, to the uppermost portion thereof. Note that the compact electromagnetic wave absorber 4 is preferably disposed to cover the entirety of the magnetic absorber plate 2 in a plan view when seen from above so that electromagnetic waves in a high-frequency band would not directly reach the magnetic absorber plate 2.

Now, a description will be made to another aspect of the structure of the compact electromagnetic wave absorber 4 which is disposed in the combined electromagnetic wave absorber 1 of the present invention. The compact electromagnetic wave absorber 4 of the present invention may not be necessarily configured in the slanting plate structure, but can also be formed, for example, in the pyramidal shape shown in FIG. 6(A) or in the shape of a wedge shown in FIG. 6(B). The compact electromagnetic wave absorber 4, either pyramid-shaped or wedge-shaped, needs to have a plurality of electromagnetic wave absorbent layers with a low dielectric layer interposed therebetween with the layers being disposed (layered) in the direction perpendicular to the magnetic absorber plate 2.

For example, when viewed from above, the combined electromagnetic wave absorber of FIG. 6(A) exhibits no difference at first glance from the conventional combined electromagnetic wave absorber. However, when viewed in a vertical cross-section, the compact electromagnetic wave absorber 4 includes two slanting plates with a low dielectric layer interposed therebetween. Like the compact electromagnetic wave absorber configured to have a multilayer slanting plate structure, this structure provides a synergistic effect between the attenuation effect on electromagnetic waves due to a plurality of pyramidal absorb layers and the cancelling effect on electromagnetic waves due to their phase difference. In FIG. 6(A), four pyramidal structures are disposed in each one space defined by the dielectric loss plates. However, the number of pyramidal structures can be changed as appropriate depending on the entire size or the required performance of the combined electromagnetic wave absorber. Furthermore, although a regular square box structure is disposed under the pyramidal structure in FIG. 6(A), the pyramidal structure can also be directly placed on the magnetic absorber plate. For example, a pyramidal structure including two pyramidal absorbers with different size disposed in an overlaid manner is directly placed on the magnetic absorber plate as shown in FIG. 6(C) (including the low dielectric layer with a constant thickness), or alternatively, a pyramidal structure including two pyramidal absorbers with different slanting angles disposed in an overlaid manner is directly placed on the magnetic absorber plate as shown in FIG. 6(D) (including the low dielectric layer with a varying thickness). Although the case of wedge-shaped structure is not illustrated, but it is understood that the wedge-shaped structure can have, as its cross section, the right or left half of the shown cross section of the pyramidal structure.

In the present invention, it should be noted that a regular square box structure may be preferably employed as shown in FIG. 6(A) to effectively absorb those short-wavelength high-frequency band electromagnetic waves that impinge upon the valley portions between adjacent pyramidal absorbers. Furthermore, when viewed from above, the compact electromagnetic wave absorbers are preferably disposed so that the magnetic absorber plate is totally covered therewith.

The wedge-shaped compact electromagnetic wave absorber shown in FIG. 6(B) also includes a plurality of slanting plates disposed in parallel to each other and a low dielectric layer interposed therebetween. Like the compact electromagnetic wave absorber having a multilayer slanting plate structure or a pyramidal shape, it is possible to provide the synergistic effect between the attenuation effect on electromagnetic waves due to multiple wedge-shaped absorbent layers and the cancelling effect on electromagnetic waves due to their phase difference. Although one wedge structure is disposed in each space defined by dielectric loss plates in FIG. 6(B), the number of wedge structures can be changed as appropriate depending on the entire size or the required performance of the combined electromagnetic wave absorber. Furthermore, in FIG. 6(B), there is disposed a vertical plate between the wedge structure and the magnetic absorber plate. However, the wedge structure can be directly placed on the magnetic absorber plate. Nevertheless, to effectively absorb those short-wavelength high-frequency band electromagnetic waves that impinge upon the valley portions in between the wedges formed between adjacent combined electromagnetic wave absorbers, vertical plates may be preferably employed as shown in FIG. 6(B). Furthermore, when viewed from above, the compact electromagnetic wave absorbers are preferably disposed so that the magnetic absorber plate is totally covered therewith.

Like the crossed electromagnetic wave absorber, the aforementioned compact electromagnetic wave absorber 4 is also made of a dielectric loss material plate. The structure, such as sheet, corrugated cardboard or honeycomb is used as the base plate for absorbing electromagnetic wave. Specific examples of dielectric loss material include carbon-containing foamed urethane, carbon-containing foamed styrene, and carbon-containing foamed polypropylene. Alternatively, it is also possible to employ an alternative dielectric loss material, for example, plastics, paper, an inorganic material such as silica or alumina, or the like, which contains carbon or is coated with a carbon layer. Carbon used as conductive material may be supplied in powder such as carbon black or graphite as well as in fibrous material such as carbon fiber or carbon nanotube. Furthermore, according to the present invention, the compact electromagnetic wave absorber may be formed separately from the crossed electromagnetic wave absorber. In this case, the content of conductive material in the compact electromagnetic wave absorber can be changed to the content of conductive material in the crossed electromagnetic wave absorber. The compact electromagnetic wave absorber of the present invention is provided with a plurality of electromagnetic wave absorbent layers with a low dielectric layer interposed therebetween, thereby utilizing the synergistic effect between the attenuation effect on electromagnetic waves provided by the plurality of electromagnetic wave absorbent layers and the cancelling effect on electromagnetic waves provided by their phase difference. Accordingly, while the content of conductive material in the compact electromagnetic wave absorber can be adjusted to an appropriate low concentration so as not to impair the absorption performance of the magnetic absorber plate, the improved electromagnetic wave absorption property in a high-frequency band can be attained.

The content of conductive material differs depending on the type or form of the conductive material. For example, with respect to the total mass of the dielectric loss material, the content of the powdery carbon like graphite may be preferably 1.7 mass % to 7 mass %, while the content of the fibrous carbon like carbon fiber may be preferably 0.03 mass % to 1.7 mass %, and more preferably 0.03 mass % to 0.4 mass %. Note that the fibrous carbon may be preferably used with its fiber length ranging from 0.5 mm to 7 mm, in the case of which the optimum conductivity is realized.

Furthermore, a flame retardant can be applied to the dielectric loss plate constituting the crossed electromagnetic wave absorber and to the electrically conductive sheet that constitutes the compact electromagnetic wave absorber, thereby imparting flame retardancy thereto. For example, the dielectric loss plate and the electrically conductive sheet are dipped into a flame retardant solution of a predetermined concentration, or a flame retardant solution of a predetermined concentration is applied to the dielectric loss plate and the electrically conductive sheet, and then they are dried. This can improve the flame retardancy or incombustibility of the electromagnetic wave absorber, thereby obtaining an electromagnetic wave absorber material compliant with the "noncombustible materials" stated in the Building Standards Law of Japan. The electromagnetic wave absorber obtained in this manner requires no additional noncombustible board or the like, thus providing an electromagnetic wave absorber relatively easily which has reduced weight and improved incombustibility. The present electromagnetic wave absorbers with fire-resistance are applied to anechoic rooms for automobiles and/or automobile parts which are obliged to undergo an EMI (Electro Magnetic Interference) test at high power.

The flame retardant is not limited to a particular one so long as it is applicable to a constituent material of the electromagnetic wave absorber such as the dielectric loss plate or the electrically conductive sheet. However, a boric acid or phosphoric acid flame retardant may be preferably employed. The boric acid compounds may include well-known flame retardants such as sodium borate, potassium borate, magnesium borate, strontium borate, and zinc borate. Furthermore, phosphoric acid compounds may include well-known flame retardants such as sodium phosphate, potassium phosphate, calcium phosphate, zinc phosphate, and polyphosphoric acid ammonium phosphate. With respect to the mass of each plate material, the amount of added flame retardant is preferably 5 to 50 mass % in solid content, and more preferably 10 to 30 mass %.

EXAMPLES

The present invention will be now described in more detail in accordance with the following examples. However, the present invention is not limited to these examples.

A honeycomb structure made of electrically nonconductive paper sheet and 15 mm in thickness was cut into a trapezoidal shape with a bottom (lower side) of 600 mm, a top (upper side) of 100 mm, and a height of 1400 mm. These plates were made as a fundamental member for the crossed electromagnetic wave absorber. The electrically conductive paper sheet (the carbon content of the electrically conductive sheet is 1 mass %) mixed with carbon fiber of 6 mm in fiber length and 7 μm in fiber diameter was affixed to the front and back of the two fundamental members, which served as the dielectric loss plate. In this case, carbon content in the dielectric loss plate was approximately 0.1 mass %. One of the resulting dielectric loss plates was provided with a notch at its upper portion, whereas the other was given a notch at its lower portion (see FIGS. 2(A) and 2 (B)). These notched portions were fitted into each other to thereby form the crossed electromagnetic wave absorber. This crossed electromagnetic wave absorber was placed on a ferrite tile. Then, a compact electromagnetic wave absorber manufactured according to the following respective Examples 1 to 4 or Comparative Examples 1 to 3 was placed in a space defined by the dielectric loss plate (the crossed electromagnetic wave absorber) on the ferrite tile, thereby completing a combined electromagnetic wave absorber.

Example 1

Carbon fiber of 3 mm in fiber length and 7 μm in fiber diameter was dispersed into pulp so that its carbon content was 1 mass %, and used for paper making. In this manner, an electrically conductive sheet was manufactured. This electrically conductive sheet was affixed to the front and back of an electrically nonconductive paper sheet with the paper sheet as the inner core, thereby making a corrugated cardboard sheet of a thickness of 3 mm. The sheet was then cut into pieces of 300 mm (width)×1530 mm (length). Note that the carbon content with respect to the total mass of the corrugated cardboard sheet was 0.4 mass %. The resulting corrugated cardboard sheet was dimensioned in accordance with the developed view shown in FIG. 5, so that side "a" was 600 mm, "b" was 150 mm, and "d" was 30 mm, and then bent. An adhesive was then applied to the overlap portion (d) for assembly, thereby forming a 2-layer electromagnetic wave absorber structure with a space layer (a low dielectric layer) of 150 mm. As shown in FIG. 1, the compact electromagnetic wave absorbers of this structure were slantingly placed in orientations different from one another into the four respective spaces defined by the crossed electromagnetic wave absorber. Thus, a slanting plate structure was created, and a combined electromagnetic wave absorber containing this structure was thus completed.

Example 2

The corrugated cardboard sheet similar to that of Example 1 was used to complete a compact electromagnetic wave absorber. Here, the compact electromagnetic wave absorber was similar to that of Example 1 except that the "b" of the developed view shown in FIG. 5 was 100 mm and the space layer (low dielectric layer) was 100 mm.

Example 3

The corrugated cardboard sheet similar to that of Example 1 was used to make a plurality of hollow quadrangular pyramids based on the developed view shown in FIG. 7(A). Here, the length of the bottom side of the pyramid "e" was 150 mm and its height "f" was 500 mm. Furthermore, based on the developed view shown in FIG. 7(B), a plurality of regular square tubes were made which had a bottom side "e" of 150 mm and a height "g" of 100 mm. As shown in FIG. 7(D), the two pyramids and one regular square tube were used to make a 2-layered electromagnetic wave absorber, in which the bottom side of one pyramid and the bottom side of the other pyramid were aligned with the upper side and the lower side of the regular square tube, respectively, to form a space layer (a low dielectric layer) of 100 mm therein. The electromagnetic wave absorbers formed in this manner were disposed in the four spaces defined by the crossed electromagnetic wave absorber, four at each space, 16 in total, thus completing a combined electromagnetic wave absorber.

Example 4

Graphite powder of 4 μm in particle diameter was dispersed into pulp so that its carbon content was 20 mass %, and used for paper making. In this manner, an electrically conductive sheet was manufactured. This electrically conductive sheet was affixed to the front and back of an electrically nonconductive paper sheet with the paper sheet as the inner core, thereby making a corrugated cardboard sheet of a thickness of 3 mm. Note that the carbon content with respect to the total mass of the corrugated cardboard sheet was 8 mass %. Using the resulting corrugated cardboard sheet, a 2-layered compact electromagnetic wave absorber was manufactured in the same manner as in Example 1 and placed on the ferrite tile as with Example 1, thereby completing a combined electromagnetic wave absorber.

Example 5

A combined electromagnetic wave absorber was manufactured in the same manner as in Example 1 except that the electrically conductive sheet and the honeycomb structure that constituted the electromagnetic wave absorber were given flame retardancy in advance using a flame retardant. Fireless B manufactured by TRUST LIFE CORPORATION was used for flame retardant to impart fire-resistance to the electrically conductive sheet and honeycomb structure and so on. The electrically conductive sheet was coated using a coater with a flame retardant solution having a regulated solid content concentration of 25%, and thereafter dried for one hour at 100° C., thus being subjected to processing for incombustibility. After the processing for incombustibility, a 10% flame retardant solid content was found in the mass of the electrically conductive sheet. On the other hand, the honeycomb structure was kept dipped for a predetermined period of time in an impregnant bath which contained a flame retardant solution of a solid content concentration of 25%. Thereafter, the honeycomb structure was dried for one hour at 100 degree Centigrade, thus being subjected to processing for incombustibility. After the processing for incombustibility, a 13% flame retardant solid content was found in the mass of the honeycomb structure.

Comparative Example 1

Using the same corrugated cardboard sheet as that of Example 3, an absorber of a pyramid and a regular square tube were manufactured in the same manner as in Example 3. Here, one pyramid and one regular square tube were combined together to make a single-layered electromagnetic wave absorber. The resulting electromagnetic wave absorber was disposed in the four spaces defined by the crossed electromagnetic wave absorber, four at each space, 16 in total in the same manner as in Example 3, thus completing a combined electromagnetic wave absorber.

Comparative Example 2

Carbon fiber of 3 mm in fiber length and 7 μm in fiber diameter was distributed into pulp so that its carbon content was 4 mass %, and used for paper making. In this manner, an electrically conductive sheet was made. This electrically conductive sheet was affixed to the front and back of an electrically nonconductive paper sheet with the paper sheet as the inner core, thereby making a corrugated cardboard sheet of a thickness of 3 mm. Note that the carbon content with respect low dielectric layer) (Examples 1 to 4) were all found to have good electromagnetic wave absorption properties of 20 dB to 40 dB over the range from 30 MHz to 18 GHz. Note that although not described in Table 1, all Examples were found to provide good electromagnetic wave absorption properties at 20 GHz.

TABLE 1

|  | 30 MHz | 100 MHz | 500 MHz | 1 GHz | 2 GHz | 5 GHz | 8 GHz | 10 GHz | 12 GHz | 15 GHz | 18 GHz |
| --- | --- | --- | --- | --- | --- | --- | --- | --- | --- | --- | --- |
| Example 1 | 23 dB | 22 dB | 24 dB | 25 dB | 23 dB | 25 dB | 30 dB | 33 dB | 35 dB | 40 dB | 40 dB |
| Example 2 | 23 dB | 22 dB | 24 dB | 24 dB | 24 dB | 26 dB | 30 dB | 35 dB | 32 dB | 32 dB | 30 dB |
| Example 3 | 22 dB | 21 dB | 22 dB | 25 dB | 26 dB | 28 dB | 35 dB | 40 dB | 37 dB | 35 dB | 34 dB |
| Example 4 | 20 dB | 22 dB | 21 dB | 23 dB | 22 dB | 25 dB | 30 dB | 24 dB | 22 dB | 20 dB | 20 dB |
| Com. Ex. 1 | 23 dB | 22 dB | 24 dB | 22 dB | 18 dB | 15 dB | 12 dB | 12 dB | 13 dB | 11 dB | 11 dB |
| Com. Ex. 2 | 16 dB | 15 dB | 18 dB | 20 dB | 21 dB | 22 dB | 23 dB | 23 dB | 24 dB | 22 dB | 23 dB |
| Com. Ex. 3 | 22 dB | 21 dB | 24 dB | 23 dB | 20 dB | 17 dB | 15 dB | 15 dB | 14 dB | 16 dB | 15 dB | to the total mass of the corrugated cardboard sheet was 1.6 mass %. Using this corrugated cardboard sheet, one pyramid and one regular square tube were combined together to form a single-layered electromagnetic wave absorber in the same manner as in Comparative Example 1. This electromagnetic wave absorber was disposed in the four spaces defined by the crossed electromagnetic wave absorber, four at each space, 16 in total, thus completing a combined electromagnetic wave absorber in the same manner as in Comparative Example 1.

Comparative Example 3

Using the same corrugated cardboard sheet as that of Example 3, a pyramid and a regular square tube were combined into an electromagnetic wave absorber in the same manner as in Example 3. This realized a 2-layered electromagnetic wave absorber which accommodated 2-layered pyramids closely formed inside the square tubes which were stacked in two layers, one on top of the other. The resulting electromagnetic wave absorber was disposed in the four spaces defined by the crossed electromagnetic wave absorber, four at each space, 16 in total, thus completing a combined electromagnetic wave absorber in the same manner as in Example 3.

(Evaluation of Electromagnetic Wave Absorption Property)

Measurements were made on the electromagnetic wave absorption properties of the combined electromagnetic wave absorbers according to Examples 1 to 4 and Comparative Examples 1 to 3, and the measurement results are shown in Table 1. The absorption property of the electromagnetic wave absorbers in the low frequency band from 30 MHz to 1 GHz was evaluated by the coaxial line method, while the absorption property in the high frequency band from 1 GHz to 20 GHz was evaluated by the normal incidence method. In Comparative Example 1 with the single-layered structure, the electromagnetic wave absorption property obtained was not sufficient in the high-frequency band. On the other hand, in Comparative Example 2 of the single-layer structure with its carbon content increased, the electromagnetic wave absorption property in the high-frequency band was improved, but the electromagnetic wave absorption property in the low-frequency band was reduced. Furthermore, even when the electromagnetic wave absorber plate was directly stacked upon another as in Comparative Example 3, the electromagnetic wave absorption property in the high frequency band was not much improved. On the contrary, the electromagnetic wave absorbers of the present invention having a plurality of electromagnetic wave absorbent layers with a space layer (a (Evaluation of Incombustibility)

Incombustibility of the electromagnetic wave absorbers according to Example 5 is shown in FIG. 8. As a comparison, also shown in FIG. 8 are the results of evaluation of incombustibility of the electromagnetic wave absorber according to Comparative Example 1. For the evaluation of incombustibility, employed was the inflammability test using the cone calorimeter that is specified in the "noncombustible material" test of the Building Standards Law of Japan. In Comparative Example 1, the total amount of heat generated after combustion for 20 minutes was 14.9 MJ/m$^2$. In contrast, the flame retardancy for the electromagnetic wave absorber of Example 5 was found significantly improved to be less than 4.7 MJ/m$^2$, and compliant with the "noncombustible material" of the Building Standards Law.

Note that the aforementioned embodiments are only illustrative, and changes and modifications made to the configurations in the specification will be obvious to those skilled in the art. Therefore, the present invention is intended to be limited not by the detailed descriptions of the specification and their aspects but only by the appended claims.

BRIEF DESCRIPTION OF THE DRAWINGS

FIG. 6 includes diagrams illustrating another example of the combined electromagnetic wave absorber of the present invention, FIGS. 6(A) and 6(B) being perspective views thereof and FIGS. 6(C) and 6(D) being sectional views of modified examples thereof;

Figure 1:
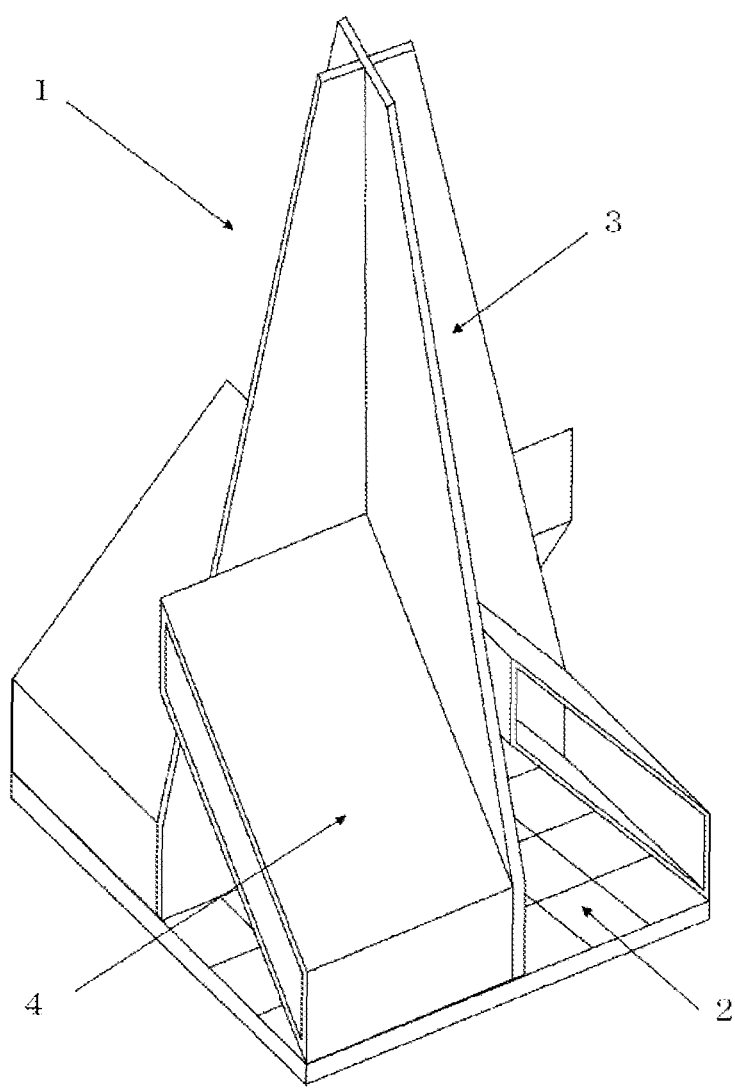
FIG. 1 is a perspective view illustrating an example of a combined electromagnetic wave absorber of the present invention.
Figure 2:
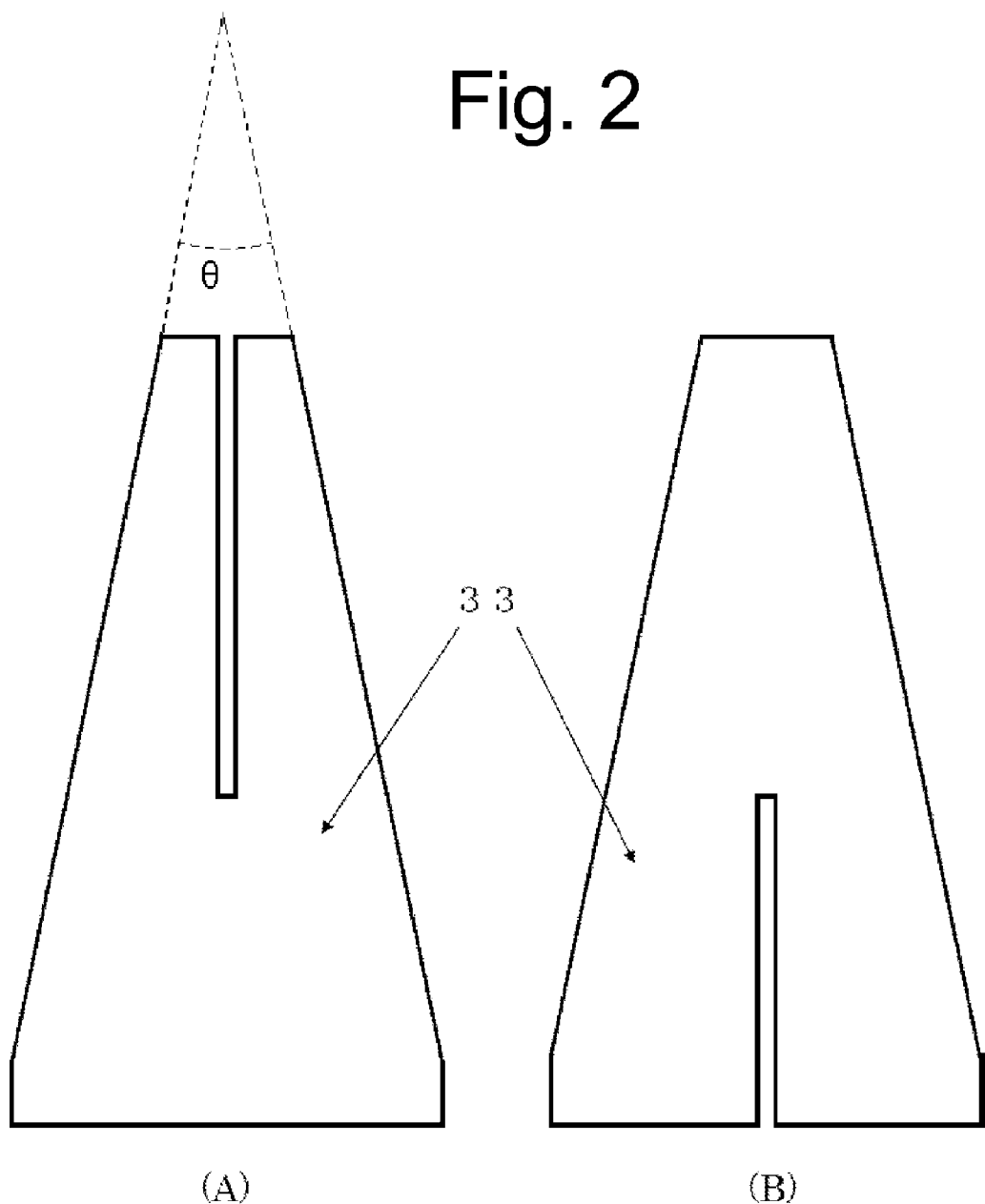
FIG. 2 includes views illustrating an example of a dielectric loss plate that constitutes a crossed electromagnetic wave absorber of the present invention.
Figure 3:
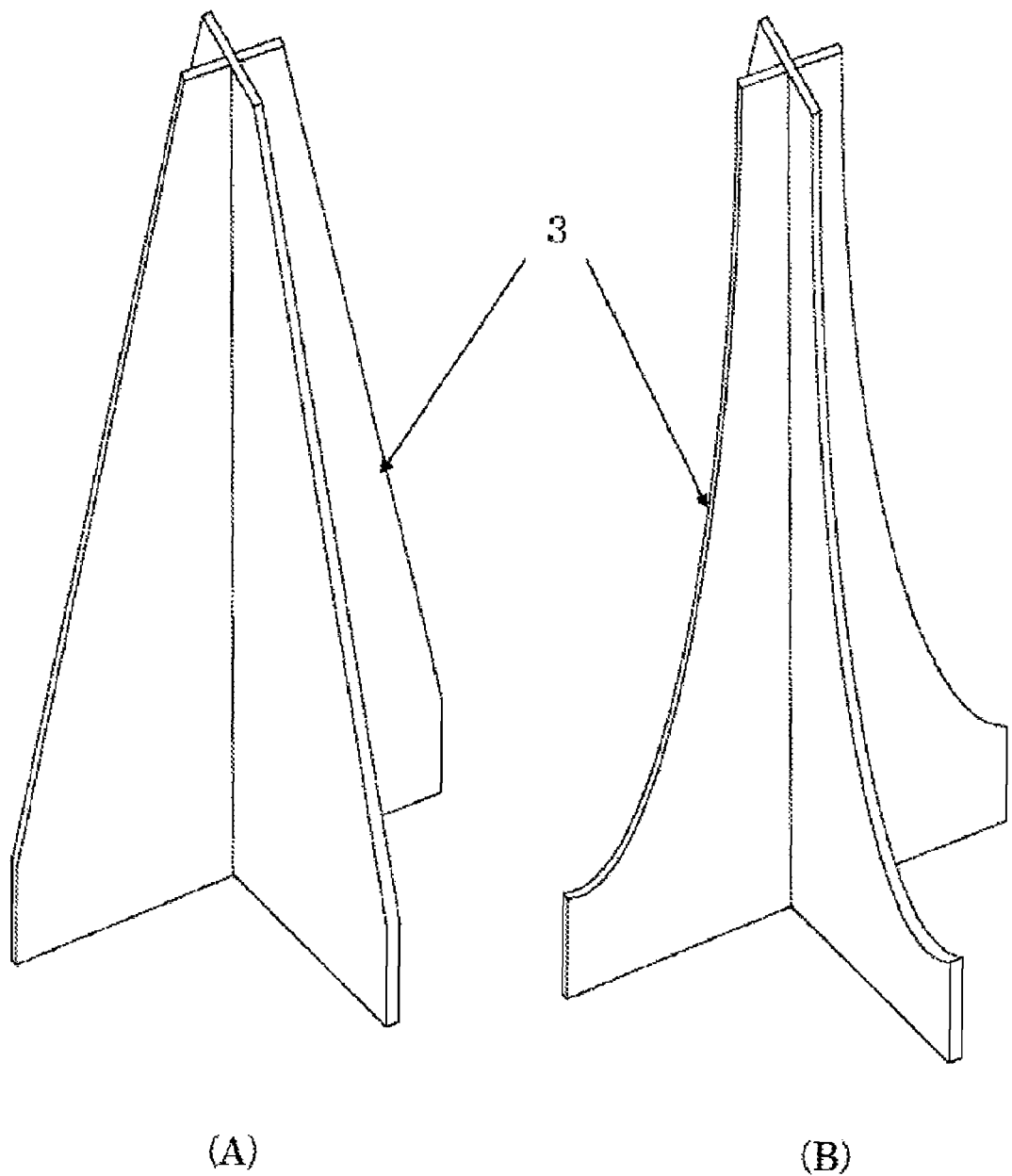
FIG. 3 includes perspective views illustrating examples of the shape of the crossed electromagnetic wave absorber of the present invention.
Figure 4:
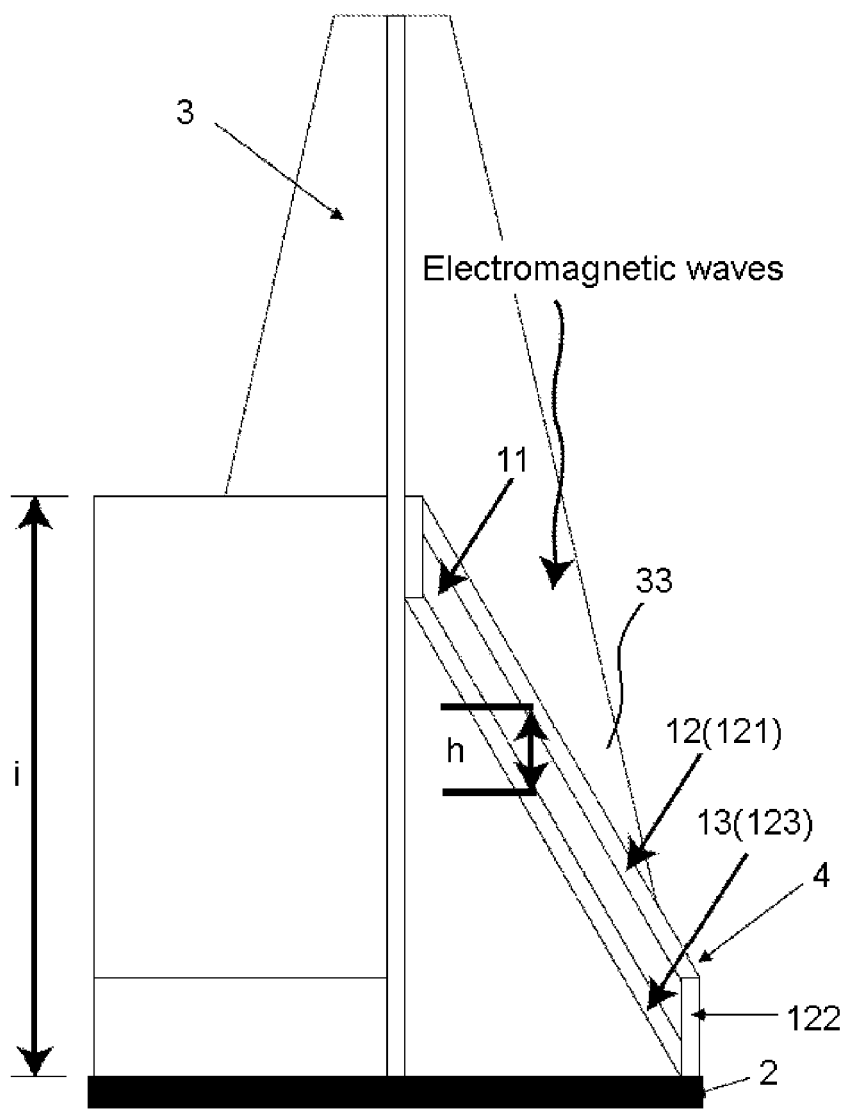
FIG. 4 is a side view illustrating the combined electromagnetic wave absorber of FIG. 1.
Figure 5:
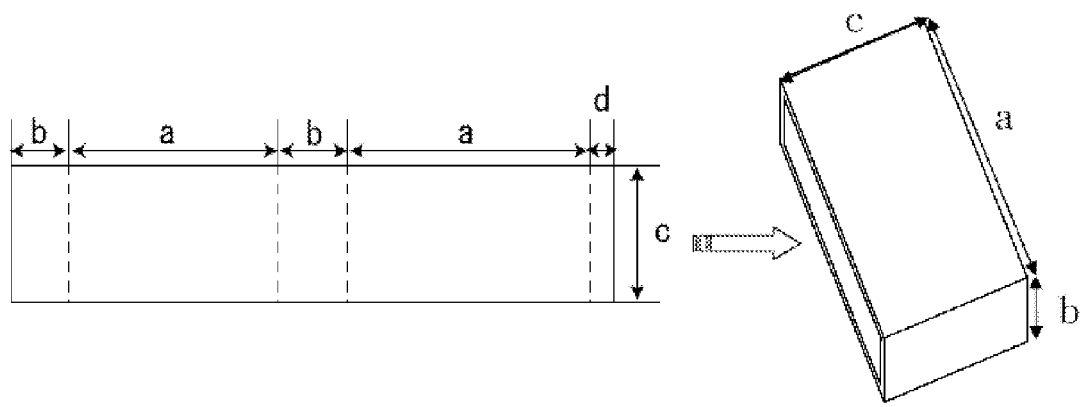
FIG. 5 shows a developed view and an as-made view of the electromagnetic wave absorber plate that forms the compact electromagnetic wave absorber of FIG. 4.
Figure 7:
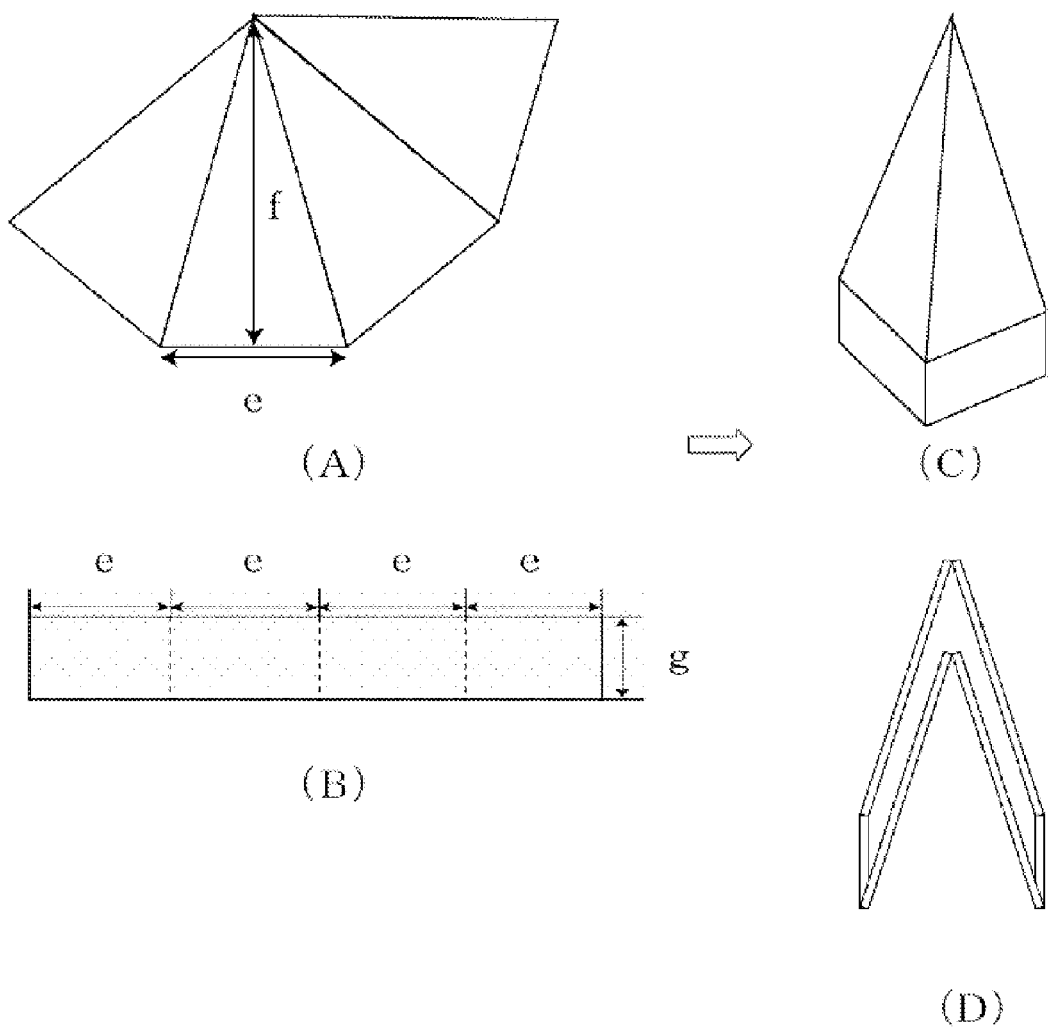
FIG. 7 includes developed views to form a compact electromagnetic wave absorber of Example 3 ((A) and (B)), and a perspective view (C) and a cross-sectional view (D) of the completed compact electromagnetic wave absorber, respectively.
Figure 8:
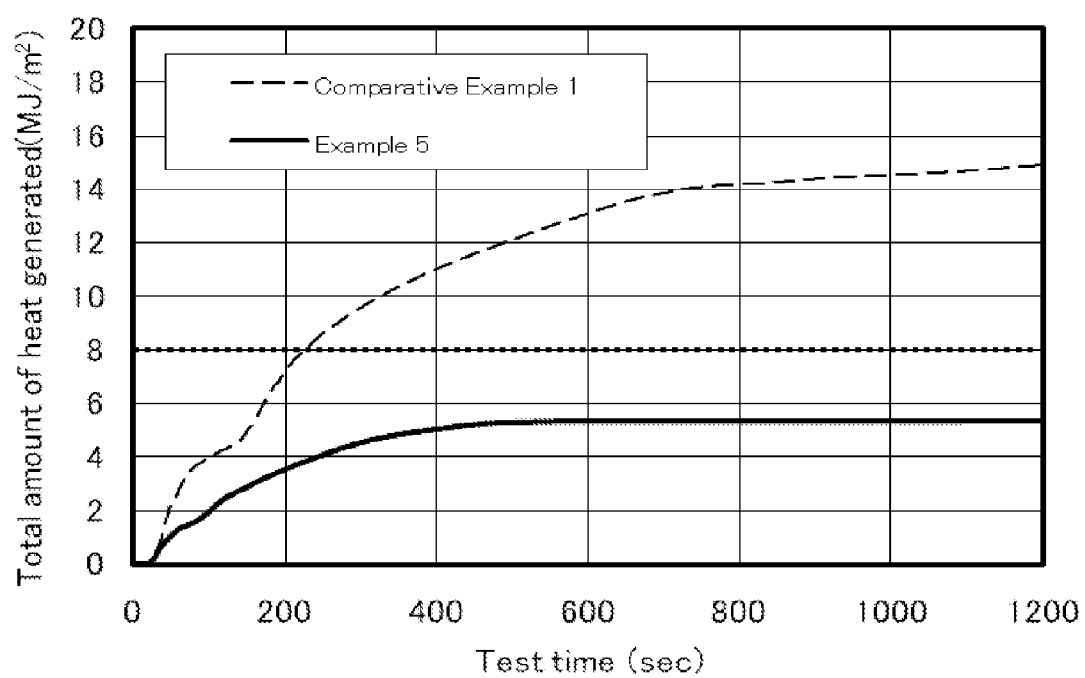
FIG. 8 is a view illustrating the test results of incombustibility of the electromagnetic wave absorbers according to Example 5 and Comparative Example 1.

| DESCRIPTION OF REFERENCE NUMERALS | |
|---|---|
| 1 | combined electromagnetic wave absorber |
| 2 | magnetic absorber plate |
| 3 | crossed electromagnetic wave absorber |
| 4 | compact electromagnetic wave absorber |
| 11 | low dielectric layer |
| 12, 13 | electromagnetic wave absorbent layer |
| 33 | dielectric loss plate |
| 121, 123 | slanting plate |
| 122 | vertical plate |

The invention claimed is:

1. A combined electromagnetic wave absorber comprising:
a magnetic absorber plate;
a crossed electromagnetic wave absorber having a plurality of crossed dielectric loss plates disposed perpendicular to the magnetic absorber plate; and
a compact electromagnetic wave absorber disposed in a space defined by the dielectric loss plates of the crossed electromagnetic wave absorber on the magnetic absorber plate, the compact electromagnetic wave absorber having a plurality of electromagnetic wave absorbent layers and a low dielectric layer interposed between the electromagnetic wave absorbent layers and having a dielectric constant lower than the electromagnetic wave absorbent layers, the electromagnetic wave absorbent layers and the low dielectric layer being disposed in a direction perpendicular to the magnetic absorber plate, wherein
the electromagnetic wave absorbent layers and low dielectric layer are configured such that a synergistic effect is created between,
an attenuation effect on the electromagnetic waves by multiple thermal conversions in the electromagnetic wave absorbent layers, and
a cancelling effect on at least a portion of the electromagnetic waves due to phase difference.

2. The combined electromagnetic wave absorber according to claim 1, wherein the low dielectric layer has a thickness in a direction perpendicular to the magnetic absorber plate from 10 mm to 500 mm.

3. The combined electromagnetic wave absorber according to claim 1, wherein the compact electromagnetic wave absorber has a dimension in the direction perpendicular to the magnetic absorber plate is 200 mm to 700 mm.

4. The combined electromagnetic wave absorber according to claim 2, wherein the compact electromagnetic wave absorber has a dimension in the direction perpendicular to the magnetic absorber plate is 200 mm to 700 mm.

* * * * *